(12) United States Patent
Futamura et al.

(10) Patent No.: US 7,471,119 B2
(45) Date of Patent: Dec. 30, 2008

(54) ELECTRONIC CIRCUIT DEVICE

(75) Inventors: Takaharu Futamura, Anjo (JP); Shigekazu Sugimoto, Takahama (JP)

(73) Assignees: DENSO CORPORATION, Kariya (JP); Anden Co., Ltd., Anjo (JP)

( * ) Notice: Subject to any disclaimer, the term of this patent is extended or adjusted under 35 U.S.C. 154(b) by 66 days.

(21) Appl. No.: 11/798,961

(22) Filed: May 18, 2007

(65) Prior Publication Data

US 2008/0001652 A1 Jan. 3, 2008

(30) Foreign Application Priority Data

May 22, 2006 (JP) .............................. 2006-141247

(51) Int. Cl.
*H03K 5/22* (2006.01)
*H03K 5/153* (2006.01)

(52) U.S. Cl. ........................................ 327/77; 327/307
(58) Field of Classification Search ................. 327/307, 327/72, 73, 77, 78
See application file for complete search history.

(56) References Cited

U.S. PATENT DOCUMENTS

| | | | |
|---|---|---|---|
| 4,169,232 A * | 9/1979 | Henrich | ........................ 327/78 |
| 5,043,940 A | 8/1991 | Harari | |
| 5,095,344 A | 3/1992 | Harari | |
| 5,168,465 A | 12/1992 | Harari | |
| 5,198,380 A | 3/1993 | Harari | |
| 5,268,318 A | 12/1993 | Harari | |
| 5,268,319 A | 12/1993 | Harari | |
| 5,268,870 A | 12/1993 | Harari | |
| 5,293,560 A | 3/1994 | Harari | |
| 5,430,682 A | 7/1995 | Ishikawa et al. | |
| 5,434,825 A | 7/1995 | Harari | |
| 5,544,118 A | 8/1996 | Harari | |
| 5,554,553 A | 9/1996 | Harari | |
| 5,568,439 A | 10/1996 | Harari | |
| 5,583,812 A | 12/1996 | Harari | |
| 5,642,312 A | 6/1997 | Harari | |
| 5,712,819 A | 1/1998 | Harari | |
| 5,835,415 A | 11/1998 | Harari | |
| 5,862,081 A | 1/1999 | Harari | |
| 5,909,390 A | 6/1999 | Harari | |
| 5,963,480 A | 10/1999 | Harari | |
| 6,037,832 A * | 3/2000 | Kaminishi | ................... 327/538 |
| 6,462,988 B1 | 10/2002 | Harari | |

(Continued)

FOREIGN PATENT DOCUMENTS

JP  A-9-088708  3/1997

(Continued)

*Primary Examiner*—Long Nguyen
(74) *Attorney, Agent, or Firm*—Posz Law Group, PLC

(57) ABSTRACT

An electronic circuit device has a current correction circuit that supplies a correction current which is capable of offsetting an increment or a decrement of a consumption current of a signal processor circuit that varies based on a signal level of an input signal. Therefore, even if the consumption current of the signal processor circuit varies based on the signal level of the received input signal, the variation of the consumption current is offset by the current correction circuit. As a result, even if the consumption current varies based on the signal level of the input signal, since a current that flows in a resistor does not vary, a voltage drop can be held constant. Accordingly, it is possible to accurately conduct a comparison determination by a comparator.

5 Claims, 8 Drawing Sheets

U.S. PATENT DOCUMENTS

| | | |
|---|---|---|
| 6,504,762 B1 | 1/2003 | Harari |
| 6,570,790 B1 | 5/2003 | Harari |
| 6,914,817 B2 | 7/2005 | Harari |
| 2005/0243601 A1 | 11/2005 | Harari |

FOREIGN PATENT DOCUMENTS

| | | |
|---|---|---|
| JP | A-10-022742 | 1/1998 |

* cited by examiner

ELECTRONIC CIRCUIT DEVICE

CROSS REFERENCE TO RELATED APPLICATION

This application is based on and incorporates herein by reference Japanese Patent Application No. 2006-141247 filed on May 22, 2006.

FIELD OF THE INVENTION

The present invention relates to an electronic circuit device that is connected to at least one of a power supply potential side and a reference potential side of a drive power supply source through a current limit resistor that is a protective resistor capable of limiting a current to a given value or lower, and has a voltage comparator circuit that compares a signal voltage of an input signal with a given reference voltage that is determined based on a power supply potential to output the comparison result.

BACKGROUND OF THE INVENTION

A conventional electronic circuit device has a voltage comparator circuit that compares a signal voltage of an input signal with a given voltage that is determined based on a power supply potential to output a comparison result. This circuit device may be used, for example, as a temperature sensor circuit as disclosed in JP 9-88708A. In this temperature sensor circuit, a change in a resistance due to the temperature of an exhaust gas temperature sensor is detected as a change in the voltage, input to a comparator, and compared with a given reference voltage. As a result, it is possible to determine whether the temperature detected by the exhaust gas temperature sensor exceeds a given set temperature or not.

Specifically, in this temperature sensor circuit, a voltage at a common connection point between an exhaust gas temperature sensor and a voltage division resistor circuit is input to an inverting input terminal of the comparator of a comparator circuit through a resistor. Also, a voltage at the common connection point between resistors which are connected in series between a power supply terminal and a ground terminal is input to a non-inverting input terminal of the comparator as a reference voltage.

Here, this temperature sensor circuit may be integrated into an electronic control unit (ECU) that is mounted in a vehicle, the drive electric power is generally supplied from a battery device provided in the vehicle. The ECU is connected to the battery device through a current limit resistor used as a protective resistor so that, even when a high voltage is applied directly to the ECU from a power generation device such as an alternator in a state where the battery device is disconnected from the ECU, a large current does not flow in the ECU. As a result, this current limit resistor causes a voltage drop.

For example, as shown in FIG. 8, an electronic circuit device 100 may be designed as an integrated circuit and has a signal processor circuit 102 and a voltage comparator circuit 104. The signal processor circuit 102 subjects an input signal Sig1 input from an input terminal IN1 to given signal processing to output a processed signal to an output terminal OUT1. The voltage comparator circuit 104 compares an input signal Sig2 input from an input terminal IN2 with a threshold voltage Vth to output a comparison result to an output terminal OUT2. Those circuits 102 and 104 are incorporated into an ECU. The ECU is connected to a battery device Batt through a current limit resistor R7. As a result, a supply voltage Vcc that is supplied to the electronic circuit device 100 becomes a value (Vcc=VB−ΔV) obtained by subtracting a voltage drop ΔV developed by the current limit resistor R7 from a terminal voltage VB of the battery device Batt.

The voltage drop ΔV is a product of a current Icc that flows in the electronic circuit device 100 and a resistance of the current limit resistor R7. A consumption current I1 of the signal processor circuit 102 varies according to a signal voltage level of the input signal Sig1. Therefore, even if a consumption current (I2+I3) of the voltage comparator circuit 104 is stabilized or do not vary, it is difficult to suppress a variation of the voltage drop ΔV due to the current limit resistor R7. The variation in the voltage drop ΔV directly affects a reference voltage source Vref that provides the threshold voltage Vth of the voltage comparator circuit 104. Therefore, the variation in the voltage drop ΔV directly leads to a variation in the threshold voltage Vth that is a comparison reference of the voltage comparator circuit 104, and the comparison determination of the input signal Sig2 due to the comparator CP1 may become inaccurate.

SUMMARY OF THE INVENTION

It is therefore an object of the present invention to provide an electronic circuit device that enables its voltage comparator circuit to accurately conduct a comparison determination.

According to an aspect of the present invention, an electronic circuit device is connectable to at least one of a power supply potential side and a reference potential side of a power supply source through a current limit resistor that limits a current to a given value or lower. The electronic circuit device includes a signal processor circuit, a voltage comparator circuit and a correction circuit. The signal processor circuit conducts given signal processing on a first input signal applied to a first input terminal and consumes a consumption current, which varies in accordance with a signal voltage of the first input signal. The voltage comparator circuit compares a signal voltage of a second input signal applied to a second input terminal separately from the first input signal with a given reference voltage determined based on a power supply potential to output a comparison result. The correction circuit offsets a variation of the consumption current of the signal processor circuit so that the given reference voltage is maintained unchanged. The correction circuit may supply a correction current or change a resistance of the current limit resistor based on the signal voltage of the input signal thereby to maintain the current flowing in the current limit resistor or the voltage of the same to be constant.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

First Embodiment

Figure 1:
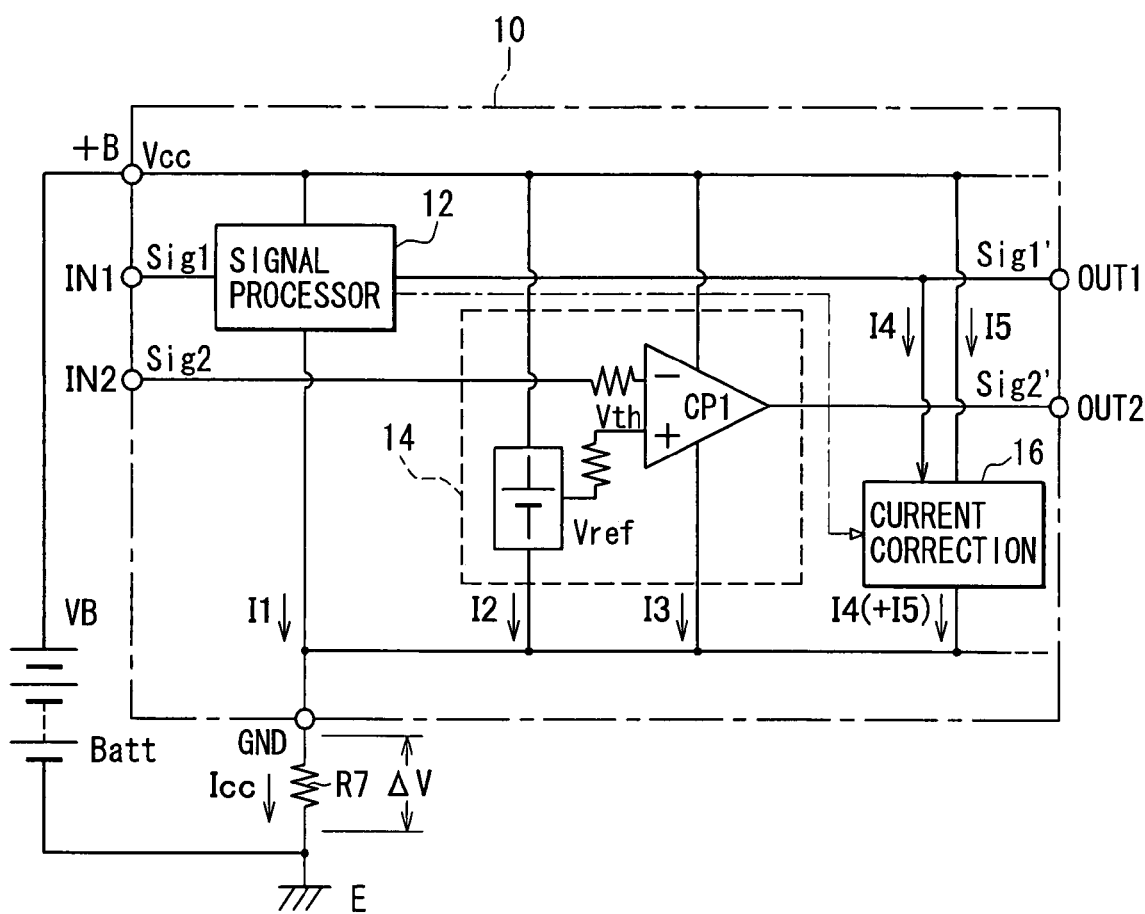
FIG. 1 is a circuit diagram showing an electronic circuit device according to a first embodiment of the present invention.

As shown in FIG. 1, an electronic circuit device 10 includes a signal processor circuit 12, a voltage comparator circuit 14, and a current correction circuit 16. This device 10 is usually integrated as an integrated circuit (IC) on a semiconductor substrate. The electronic circuit device 10 may include arbitrary electronic circuits in addition to those circuits. A plurality of voltage comparator circuits 14 may be included in the electronic circuit device 10 according to the intended purpose of the electronic circuit device 10.

The electronic circuit device 10 is provided with plural terminals in order to receive a supply of the drive electric power from an outside or in order to input or output diverse electric signals. For example, a power supply terminal +B and a ground terminal GND are provided as terminals that receive the respective drive electric powers of the signal processor circuit 12, the voltage comparator circuit 14, and the current correction circuit 16. Also, an input terminal IN1 and an input terminal IN2 are provided as terminals that receive an input signal Sig1, and an output terminal OUT1 and an output terminal OUT2 are provided as terminals that output signals Sig1' and Sig2'. When the output signal Sig1' is not output to the outside, but is output to another circuit within the electronic circuit device 10, the output terminal OUT1 or the output terminal OUT2 may be omitted. On the other hand, when a plurality of voltage comparator circuits 14 are provided, a plurality of output terminals OUT2 are also provided correspondingly.

The signal processor circuit 12 subjects the input signal Sig1 (first input signal) that is input from the input terminal IN1 to given signal processing, and a consumption current I1 of the circuit 12 varies based on the signal voltage of the received input signal Sig1. For example, the input signal Sig1 may represent whether headlights of a vehicle are lighted or not. The signal processor circuit 12 converts the input signal Sig1 (for example, L level (substantially 0V) at the time of lighting and H level (substantially 12V) at the time of non-lighting), which is input to the input terminal IN1, to an electric signal of a TTL level (TTL-L level (substantially 0V) at the time of lighting and a TTL-H level (substantially 5V) at the time of non-lighting) and produces them to the output terminal OUT1 as the output signal Sig1'. That is, the signal processor circuit 12 conducts signal level conversion as its signal processing. As a result, it is possible to transmit information indicative of the headlight conditions of the vehicle to another circuit within the electronic circuit device 10 or a CPU of an ECU that is equipped with the electronic circuit device 10.

Figure 2:
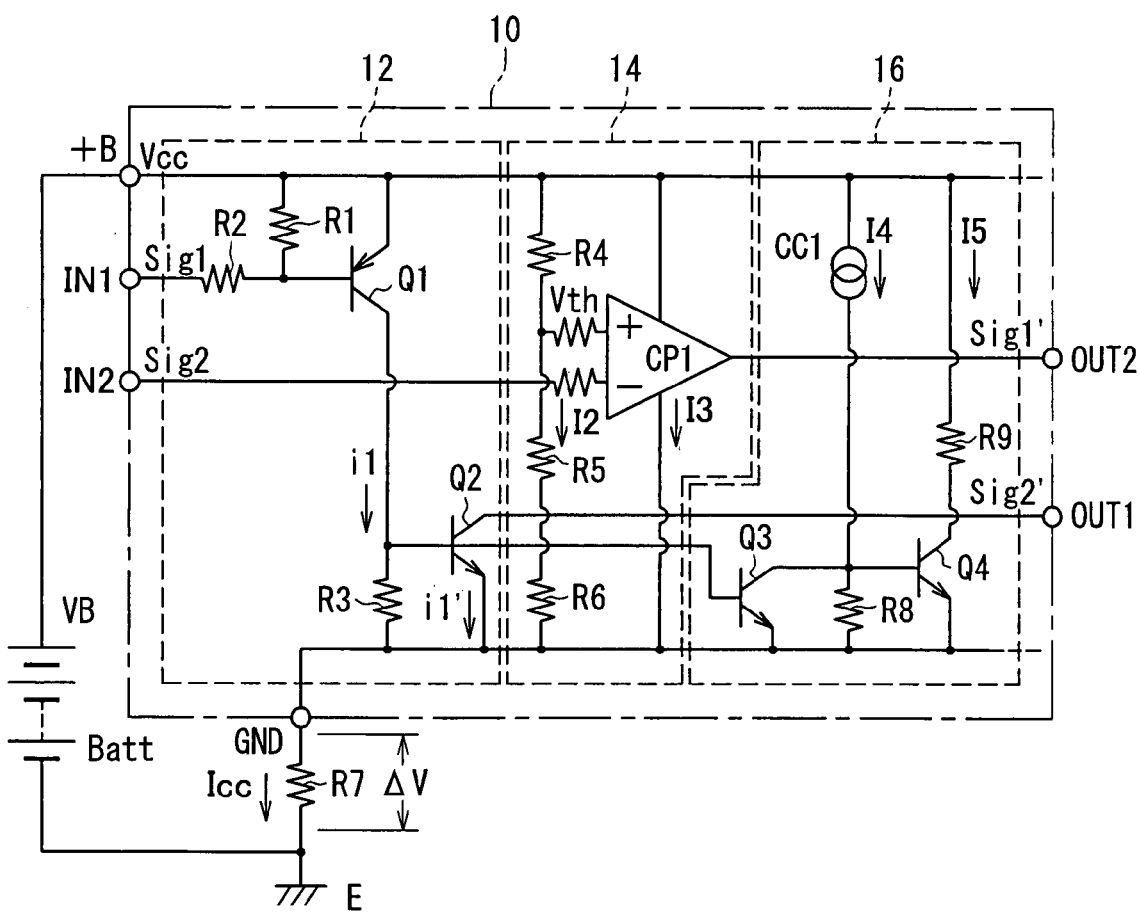
FIG. 2 is a circuit diagram showing a detail of the electronic circuit device of the first embodiment.

The signal processing circuit 12 is shown in detail in FIG. 2. That is, as shown in FIG. 2, a PNP type transistor Q1 is provided between the power supply terminal +B and the ground terminal GND so that the input signal Sig1 that is input from the input terminal IN1 can be input to the transistor Q1 through a resistor R2. The other terminal of the resistor R2 having one terminal connected to the input terminal IN1 is connected to a base of the transistor Q1. An emitter of the transistor Q1 is connected to the power supply terminal +B, and a collector thereof is connected to the ground terminal GND through a resistor R3. Also, a resistor R1 is connected between the base and the emitter of the transistor Q1.

A NPN type transistor Q2 is provided so that a signal that is output from the transistor Q1 can be output to the output terminal OUT1 through the transistor Q2. That is, the collector of the transistor Q1 is connected to a base of the transistor Q2. An emitter of the transistor Q2 is connected to the ground terminal GND, and a collector of the transistor Q2 is connected to the output terminal OUT1. The output terminal OUT1 is connected with the collector of the transistor Q2 in an open-collector configuration. In this case, the output terminal OUT1 is connected to a power supply line that is set to a potential of +5V from the ground terminal GND through a resistor (not shown).

In the signal processor circuit 12, the electric signal of the TTL level according to the lighting or the non-lighting of the headlights of the vehicle is output from the output terminal OUT1. That is, when the headlights are lighted, the input terminal IN1 is input with the input signal Sig1 of the L level (substantially 0V). As a result, the transistor Q1 is in an ON state, and a current i1 flows between the emitter and the collector of the transistor Q1. As a result, the transistor Q2 is in the ON state, and a current i1' flows between the emitter and the collector of the transistor Q2. For this reason, since the collector of the transistor Q2 changes from the TTL-H level to the TTL-L level, it is possible to output the electric signal of the TTL-L level from the output terminal OUT1 to indicate that the headlights of the vehicle are lighted.

On the other hand, when the headlights are not lighted, since the input terminal IN1 is input with the input signal Sig1 of the H level (substantially 12V), no current flows in the base of the transistor Q1, and the transistor Q1 is in an OFF state. Also, since no current flows in the base of the transistor Q2, the transistor Q2 is in an OFF state, and the collector of the transistor Q2 maintains the TTL-H level. For this reason, it is possible to output the electric signal of the TTL-H level from the output terminal OUT1 to indicate that the headlights of the vehicle are not lighted.

As described above, in the signal processor circuit 12, when the input terminal IN1 is input with the input signal Sig1 of the L level (first level), both of the transistors Q1 and Q2 turn on. Therefore, the current i1 flows between the emitter and the collector of the transistor Q1, and the current i1' flows between the emitter and the collector of the transistor Q2. On the contrary, when the input terminal IN1 is input with the input signal Sig1 of the H level (second level), both of the transistors Q1 and Q2 turn off. Therefore, a current hardly flows between the emitters and the collectors of the transistors Q1 and Q2. That is, in the signal processor circuit 12, the consumption current I1 varies between 0 A and (i1+i1') A [amperes] based on the signal level (signal voltage) of the input signal Sig1.

As shown in FIG. 1, the voltage comparator circuit 14 compares the signal voltage of the input signal Sig2 which is input from the other input terminal IN2 different from the input signal Sig1 with the threshold voltage Vth (given reference voltage) that is varied based on the supply voltage Vcc of the power supply terminal +B to output the comparison result. The voltage comparator circuit 14 has a comparator CP1 and a reference voltage source Vref. More specifically, for example, the voltage comparator circuit 14 compares the input signal Sig2, which may be applied by converting the amount of current that flows in the headlights into a voltage and inputting the voltage to the input terminal IN2, with the threshold voltage Vth that is output from the reference voltage source Vref. The comparator CP1 outputs the comparison result to the output terminal OUT2 as the output signal Sig2'. With the above operation, it is possible to transmit information indicating whether the amount of current that flows in the headlights of the vehicle exceeds a given value or not, to another circuit of the electronic circuit device 10 or the CPU of the ECU that is equipped with the electronic circuit device 10.

The voltage comparator circuit 14 is shown in detail in FIG. 2. That is, the comparator CP1 receives the input signal Sig2 that is input from the input terminal IN2 to one of input terminals, and receives the threshold voltage Vth that is the reference of the comparison determination to another input terminal. That is, an inverting input terminal (−) of the comparator CP1 is connected with the input terminal IN2, and a non-inverting input terminal (+) of the comparator CP1 is connected with the reference voltage source Vref. Also, the output terminal of the comparator CP1 is connected to the output terminal OUT2. The comparator CP1 is connected between the power supply terminal +B and the ground terminal GND so as to receive the supply of the driving electric power from the supply terminal +B, and a consumption current I3 continuously flows regardless of the input state.

On the other hand, the reference voltage source Vref supplies the threshold voltage Vth that is determined based on the supply voltage Vcc (supply potential), and has, for example, resistors R4, R5 and R6, which are connected in series between the power supply terminal +B and the ground terminal GND. That is, the resistances of those resistors R4, R5 and R6 are so set as to provide the given threshold voltage Vth, which corresponds to Vcc×R4/(R4+R5+R6), from the connection point between the resistor R4 and the resistor R5. The output of the reference voltage source Vref, that is, the connection point between the resistor R4 and the resistor R5 is connected to the non-inverting input terminal of the comparator CP1. Because the reference voltage source Vref is so configured to connect the R4, R5 and R6 between the power supply terminal +B and the ground terminal GND, the consumption current I2 continuously flows.

The ECU that is equipped with the electronic circuit device 10 is connected to the battery device Batt through a current limit resistor R7 as a protective resistor so that a large current does not flow in the ECU even if a high voltage is applied directly to the ECU from the power generation device such as an alternator in a state the battery device Batt of the vehicle is removed or disconnected from the ECU. For that reason, as shown in FIGS. 1 and 2, when the ground terminal GND of the electronic circuit device 10 is connected to the ground E (reference potential) not directly but through the current limit resistor R7, for example, when the terminal voltage of the battery device Batt is VB (for example, 12V), the power supply voltage Vcc becomes a value (=VB−ΔV) which is smaller than the terminal voltage VB by a voltage drop ΔV developed by the current limit resistor R7. The threshold voltage Vth due to the reference voltage source Vref is a divided voltage of that value. Thus, when the voltage drop ΔV developed by the current limit resistor R7 varies, the threshold voltage Vth also varies together.

In other words, the threshold voltage Vth that is output from the reference voltage source Vref varies due to a change as much as the voltage drop ΔV that corresponds to the variation in the current Icc of the electronic circuit device 10. Therefore, the reference per se that is a reference of the comparison voltage which is input to the voltage comparator circuit 14 varies, resulting in that the comparison determination of the input signal Sig2 by the comparator CP1 may be inaccurately made. Under the circumstances, the electronic circuit device 10 according to this embodiment provides the current correction circuit 16.

As shown in FIG. 1, the current correction circuit 16 is configured to supply a correction current I5 that can offset the increment or decrement of the consumption current of the signal processor circuit 12 which fluctuates based on the signal voltage of the input signal Sig1. The current correction circuit 16 generates the correction current I5 based on the operating state of the signal processor circuit 12.

For example, as shown in FIG. 2, a transistor Q3 is provided in the correction circuit 16. Its base is connected to the collector of the transistor Q1, and its emitter is connected to the ground terminal GND as with the transistor Q2 of the signal processor circuit 12. Further, a transistor Q4 is provided to supply a correction current I5 based on the collector output of the transistor Q3. The transistor Q4 is connected between the power supply terminal +B and the ground terminal GND with its collector being connected through a resistor R9. Also, a constant current source CC1 and a resistor R8 that is connected in series with the constant current source CC1 are connected between the power supply terminal +B and the ground terminal GND. The constant current source CC1 side of the resistor R8 is connected to the base of the transistor Q4 so that the constant voltage that is developed by the resistor R8 is applicable to the base of the transistor Q4.

The constant current source CC1 is set so that a given constant current I4 flows. Also, the resistors R8 and R9 are set so that the current I5 that flows between the collector and the emitter of the transistor Q4, that is, between the supply terminal +B and the ground terminal GND becomes equal to the consumption current I1 (=i1+i1') caused by the signal processor circuit 12 (I5=i1+i1'). Also, the transistor Q4 and the resistor R9, which are connected between the supply terminal +B and the ground terminal GND, and the resistor R8 that is connected between the base and the emitter of the transistor Q4 form a current supply section that supplies a correction current based on a given constant current.

With the current correction circuit 16, when the input signal Sig1 of the H level is input to the input terminal IN1, a current hardly flows between the emitters and the collectors of the transistors Q1 and Q2, and the consumption current of the signal processor circuit 12 is substantially 0 A (zero ampere), a current also hardly flows in the base of the transistor Q3, and maintains the OFF state. As a result, the base of the transistor Q4 that is connected to the collector of the transistor Q3 is applied with the constant voltage that is developed by the constant current source CC1 and the resistor R8. Thus, the transistor Q4 is in the ON state, and the current I5 flows in the resistor R9. On the contrary, when the input signal Sig1 of the L level is input to the input terminal IN1, and both of the transistors Q1 and Q2 are in the ON state, a current (i1+i1') flows in the signal processor circuit 12. The transistor Q3 is also in the ON state. Therefore, since the base voltage of the transistor Q4 that is connected to the resistor R8 is substantially 0V (zero volt), the transistor Q4 is in the OFF state, and the current I5 does not flow in the resistor R9.

As a result, in the current correction circuit 16, when the input signal Sig1 of the H level is input to the signal processor circuit 12, the amount of current (i1+i1') that is consumed when the input signal Sig1 of the L level is input to the signal processor circuit 12 is allowed to flow as the correction current I5 by the transistor Q4. As a result, because the consumption current that is reduced as compared with that when the input signal Sig1 of the L level is input to the signal processor circuit 12 is increased by the amount of (i1+i1'), it is possible to make the consumption current Icc of the electronic circuit device 10 constant regardless of the signal level of the input signal Sig1. Accordingly, since it is possible to make the constant voltage drop ΔV developed by the current limit resistor R7 that is connected to the ground terminal GND of the electronic circuit device 10, the threshold voltage Vth that is output from the reference voltage source Vref is prevented from varying due to the change in the voltage drop ΔV. For this reason, it is possible to prevent the variation in the given threshold voltage Vth that is determined based on the supply voltage Vcc of the power source terminal +B, and it is possible to accurately conduct the comparison determination due to the voltage comparator circuit 14.

The above relationship of the consumption current is summarized as follows. When the input signal Sig1 of the L level is input to the signal processor circuit 12 (or the input terminal IN1), the consumption current IccL of the electronic circuit device 10 becomes the sum of the current I1 (=i1+i1) of the signal processor circuit 12, the current (I2+I3) of the voltage comparator circuit 14, and the current I4 of the current correction circuit 16 (IccL=I1+I2+I3+I4). On the contrary, when the input signal Sig1 of the H level is input to the signal processor circuit 12 (or the input terminal IN1), the consumption current IccH of the electronic circuit device 10 is the sum of the current (I2+I3) of the voltage comparator circuit 14, and the current I4+I5 of the current correction circuit 16 (IccH=I2+I3+I4+I5). Since the current I5=i1+i1' is set, the consumption current IccH at this time becomes I1(=i1+i1')+I2+I3+I4, which is equal to the consumption current IccL when the input signal Sig1 of the L level is input. That is, as described above, the consumption current Icc of the electronic circuit device 10 is made constant (Icc=I1+I2+I3+I4) regardless of the signal level of the input signal Sig1.

Second Embodiment

Figure 3:
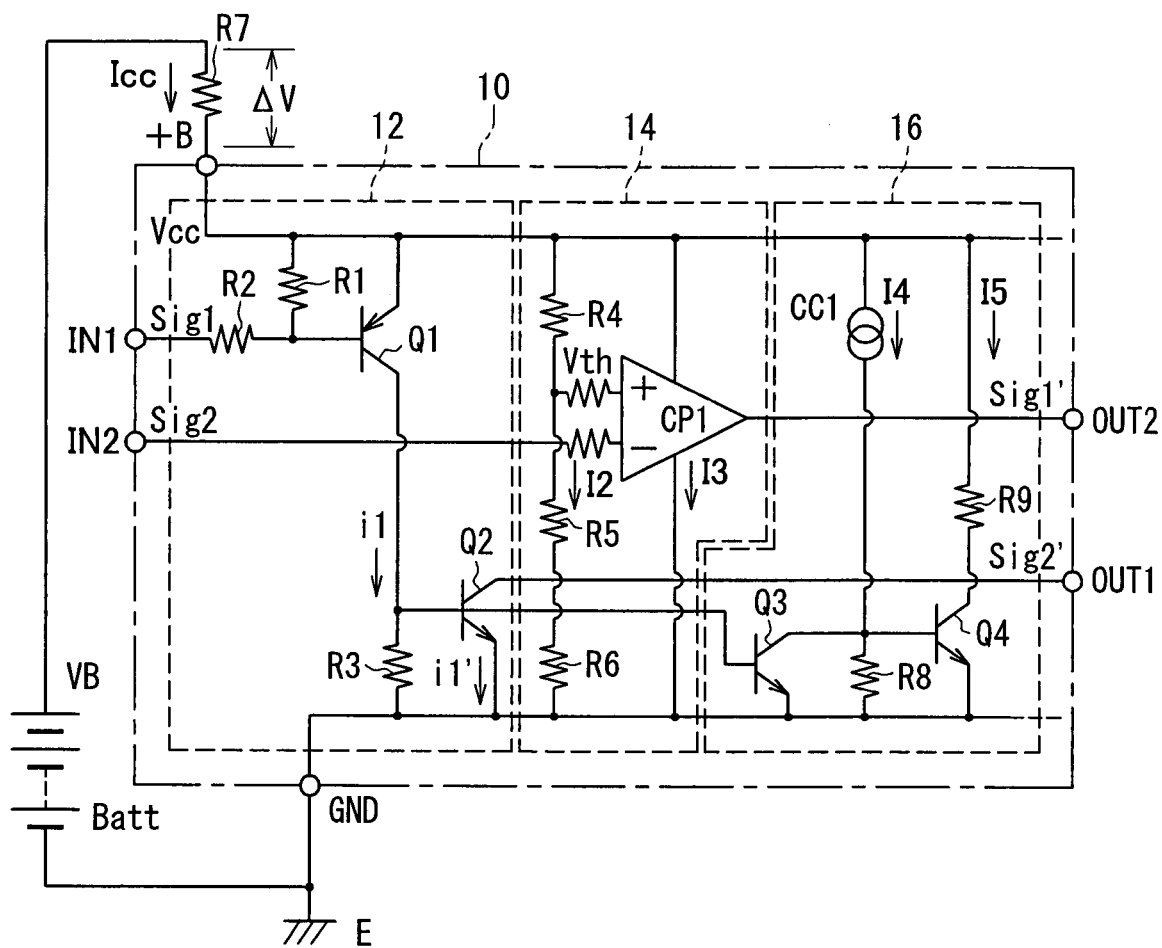
FIG. 3 is a circuit diagram showing an electronic circuit device according to a second embodiment of the present invention.

In the first embodiment shown in FIGS. 1 and 2, the current limit resistor R7 is provided at the ground terminal GND side of the battery device Batt, that is, between the ground terminal GND of the electronic circuit device 10 and the ground E. However, for example, as shown in FIG. 3, the current limit resistor R7 may be provided at the power supply terminal +B side of the battery device Batt, that is, between the power supply terminal +B of the electronic circuit device 10 and the positive terminal of the battery device Batt. This second embodiment also operates in the similar manner and provides the same effects as those described in the first embodiment.

As described above, according to the electronic circuit device 10 in the above embodiments, the current correction circuit 16 is provided to supply the correction current I5 (=i1+i1') that is capable of offsetting the increment or decrement (i1+i1') of the consumption current I1 of the signal processor circuit 12 which fluctuates based on the signal voltage of the input signal Sig1. Therefore, even if the consumption current I1 of the signal processor circuit 12 varies based on the signal level of the received input signal Sig1, the fluctuation (i1+i1') of the consumption current is offset by the correction current 16. As a result, even if the electronic circuit device 10 is connected to at least one of the power supply terminal +B side and the ground terminal GND of the battery device Batt through the current limit resistor R7 that is capable of limiting the current Icc to the given value or lower, and the consumption current I1 of the signal processor circuit 12 varies based on the signal level of the input signal Sig1, the current Icc that flows in the current limit resistor R7 does not vary. As a result, the voltage drop ΔV due to the current limit resistor R7 can be kept constant. Therefore, even if the consumption current I1 of the signal processor circuit 12 varies, the supply voltage Vcc applied to the electronic circuit device 10 can be kept constant. As such, it is possible to prevent the variation in the given threshold voltage Vth that is determined based on the supply voltage Vcc, thereby enabling the comparison determination by the comparator CP1 to be accurately made.

Also, in the electronic circuit device 10 according to the above embodiments, the current correction circuit 16 includes the constant current source CC1 that supplies the given constant current 14, and the transistor Q4 that supplies the correction current I5 based on the given constant current 14. As a result, when the signal level of the input signal Sig1 changes its two values, that is, the L level and the H level, an increment or a decrement of the consumption current I1 by the signal processor circuit 12 before and after one of those levels (L level or H level) changes to the other level (H level or L level) is canceled out by the correction current 15. In this case, the transistor Q4 supplies the correction current I5 when the consumption current I1 of the signal processor circuit 12 decreases, and allows the correction current I5 to flow, thereby offsetting the increment or decrement of the consumption current I1 of the signal processor circuit 12. Therefore, even if the signal level of the input signal Sig1 changes between the above two values, the supply voltage Vcc that is applied to the electronic circuit device 10 can be held constant, thereby making it possible to prevent the variation of the given threshold voltage Vth that is determined based on the supply voltage Vcc. Thus, it is possible to accurately make the comparison determination by the comparator CP1.

Figure 4:
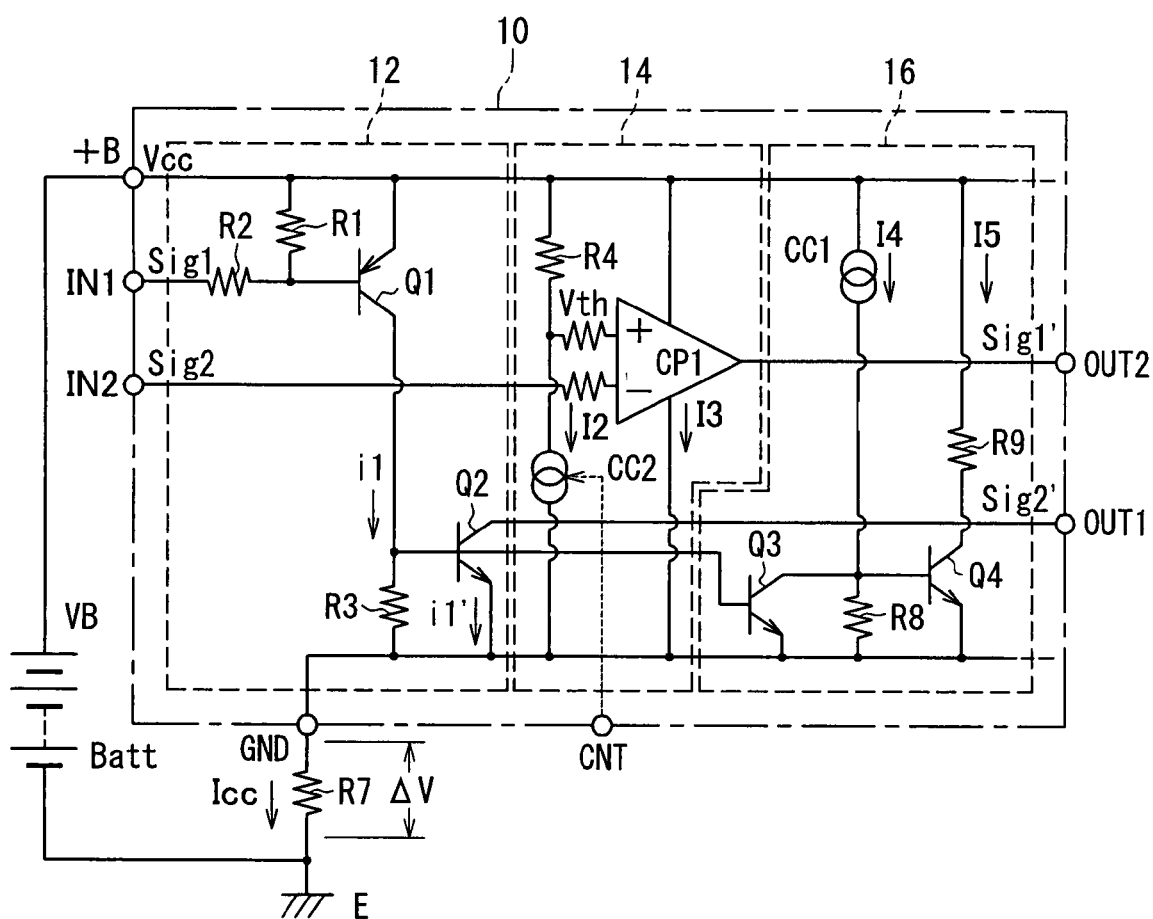
FIG. 4 is a circuit diagram showing a first modification of the first embodiment.

As a first modification of the electronic circuit device 10 according to the first embodiment, as shown in FIG. 4, the reference voltage source Vref that supplies the threshold voltage Vth to the comparator CP1 may be constructed by a constant current source CC2 that is controllable from an outside device. The resistors R5 and R6 among the voltage division resistors R4, R5 and R6 are replaced with the constant current source CC2, to thereby form a voltage comparator circuit 14. The constant current source CC2 is so adapted as to vary the output constant current I2 according to a control voltage that is input from a control terminal CNT of the electronic circuit device 10.

With this electronic circuit device 10, it is possible that the threshold voltage Vth supplied by the resistor R4 can be arbitrarily changed within a range close to the supply voltage Vcc. Accordingly, it is possible to change the threshold voltage Vth centered on the above range as compared with the first embodiment. As a result, when the characteristic of the input signal Sig2 that is input from the input terminal IN2 varies within a range close to the supply voltage Vcc, it is advantageous in that the threshold voltage Vth is easily adjusted. This modification of the reference voltage source Vref is also applicable to the second embodiment shown in FIG. 3.

Figure 5:
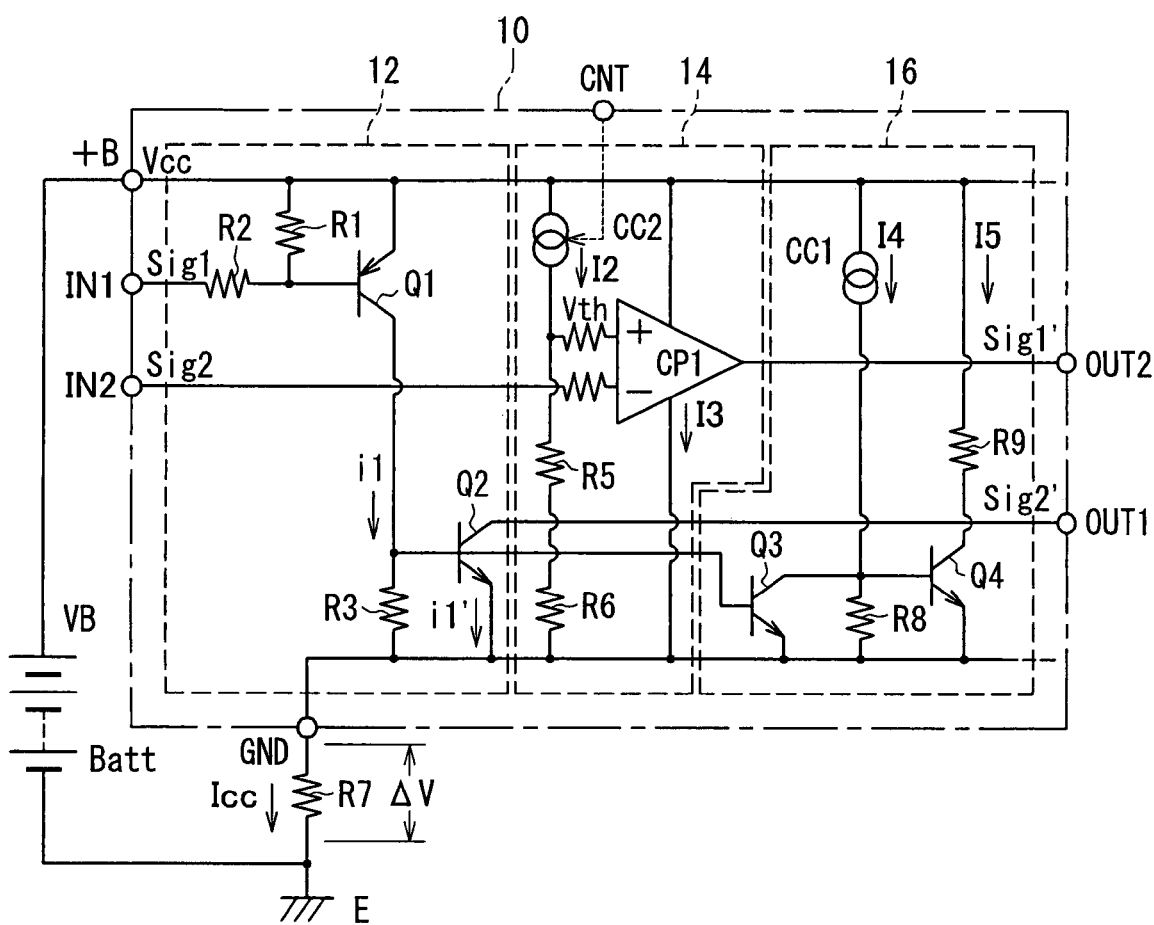
FIG. 5 is a circuit diagram showing a second modification of the first embodiment.

Also, as shown in FIG. 5, the constant current source CC2 in FIG. 4 may be connected instead of the resistor R4 among the voltage division resistors R4, R5, R6 of the voltage comparator circuit 14, to thereby form the voltage comparator circuit 14. Also, both of the resistor R5 and the resistor R6 can be integrated into one resistor.

As described above, the electronic circuit device 10 in FIG. 5 makes it possible to arbitrarily change the threshold voltage Vth that is developed by the resistors R5 and R6 within a range close to the ground terminal GND. Accordingly, since it is possible to change the threshold value voltage Vth centered on the above range. Thus, when the characteristic of the input signal Sig2 that is input from the input terminal IN2 changes within the range close to the ground terminal GND, it is advantageous in that the threshold voltage Vth is easily adjusted. This modification is also applicable to the second embodiment.

Figure 6:
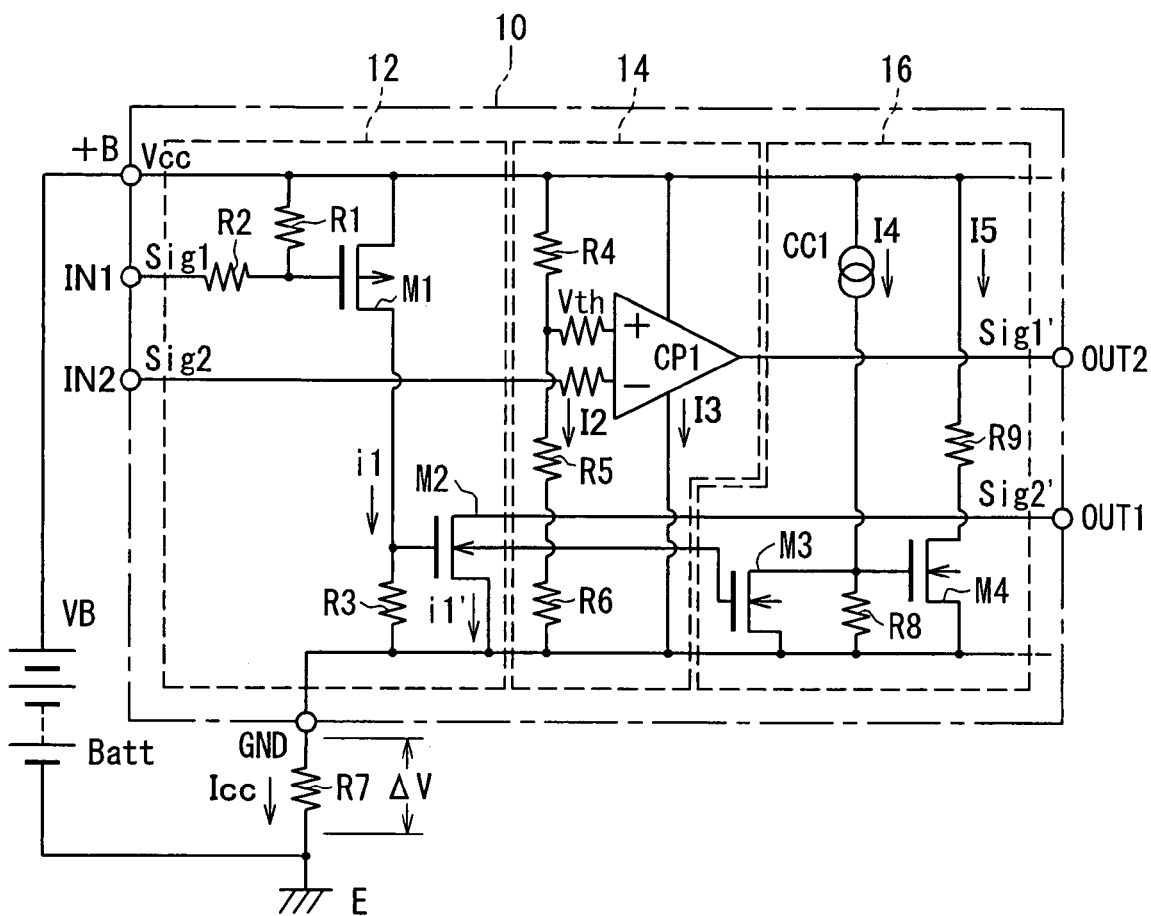
FIG. 6 is a circuit diagram showing a third modification of the first embodiment.

In the above embodiments and modifications, the electronic circuit devices 10 use the bipolar transistors Q1 to Q4. Alternatively, MOS transistors M1 to M4 may be used as shown in FIG. 6. That is, a p channel MOS transistor M1 is connected instead of the PNP transistor Q1. That is, the source of the MOS transistor M1 is connected instead of the base of the transistor Q1, the source of the MOS transistor M1 is connected instead of the emitter of the transistor Q1, and the drain of the MOS transistor M1 is connected instead of the collector of the transistor Q1, respectively. Also, MOS transistors M2 to M4 are connected instead of the NPN transistors Q2 to Q4. That is, the gates of the MOS transistors M2 to M4 are connected instead of the bases of the transistors Q2 to Q4, the sources of the MOS transistors M2 to M4 are connected instead of the emitters of the transistors Q2 to Q4, and the drains of the MOS transistors M2 to M4 are connected instead of the collectors of the transistors Q2 to Q4.

With the above modification, since the electronic circuit device 10 can be made up of the semiconductor elements mainly including the MOS transistors, it is possible to set the drive voltage range of the device 10 in the specification of the MOS transistors. For this reason, when other circuits are produced by the MOS process, the electric characteristic and the affinity for other circuits in the manufacture process are improved. This modification which uses MOS transistors may also be applied to the electronic circuit devices 10 according to the above embodiments and modifications.

Third Embodiment

Figure 7:
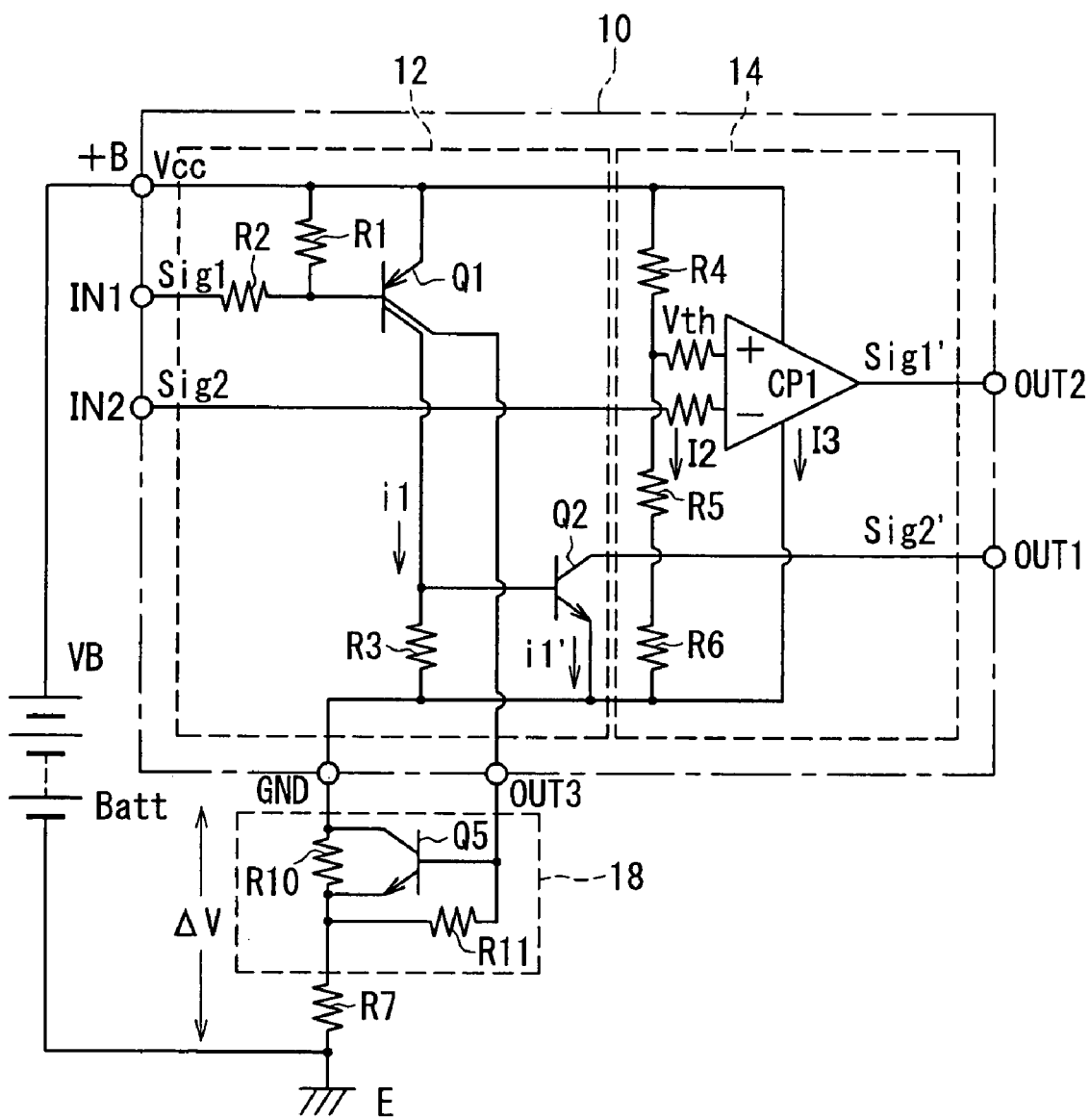
FIG. 7 is a circuit diagram showing an electronic circuit device according to a third embodiment of the present invention.
Figure 8:
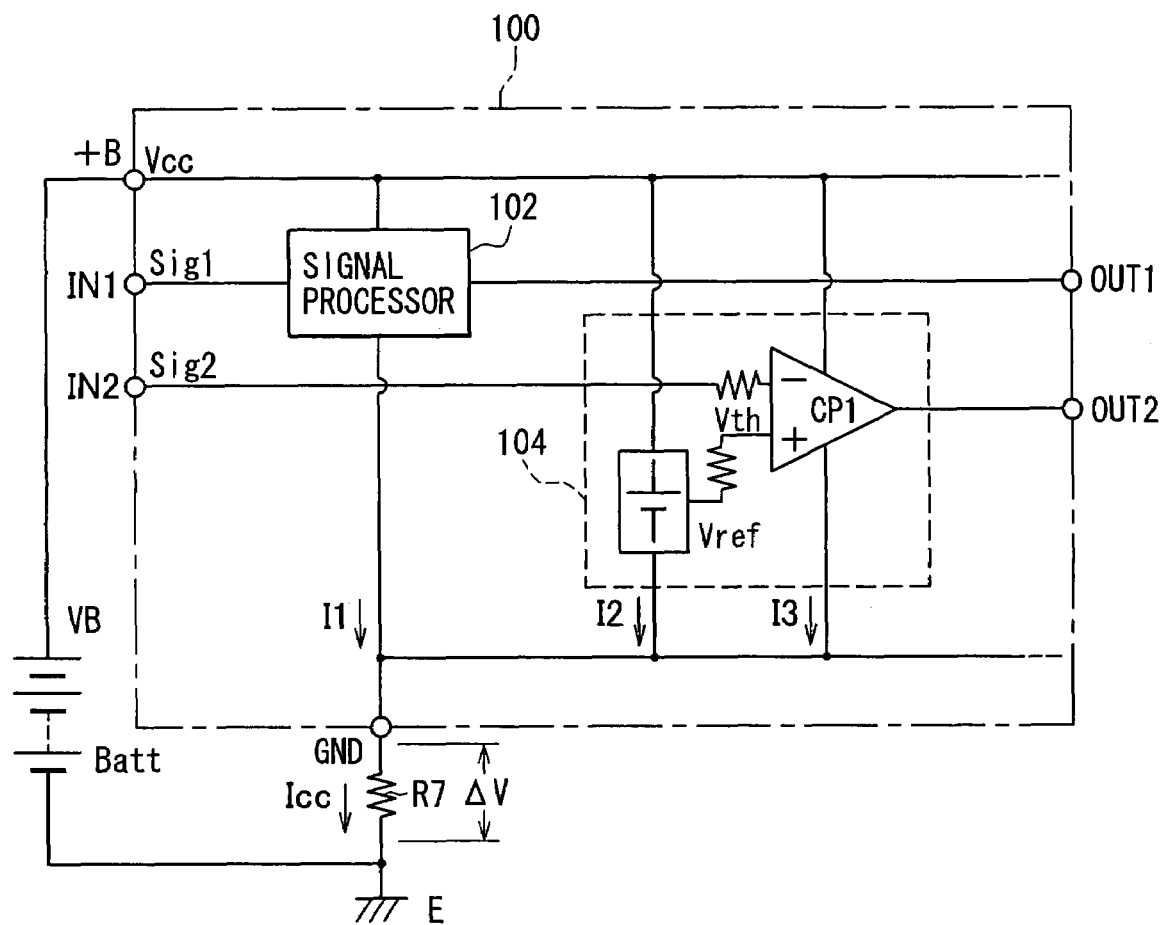
FIG. 8 is a circuit diagram showing an electronic circuit device according to a prior art.

According to a third embodiment, as shown in FIG. 7, the transistor Q1 has another collector connected to an output terminal OUT3, and a resistance correction circuit 18 is provided for changing or correcting the resistance value of the current limit resistor R7. No current correction circuit 16 in FIG. 1 is provided. The resistance correction circuit 18 has a transistor Q5 and resistors R10 and R11. The resistor R10 is connected in series to the ground terminal GND and the current limit resistor R7. Thus, the resistor R10 forms a part of the current limit resistor R7. The base, emitter and collector of the transistor Q5 are connected to the output terminal OUT3, the current limit resistor R7 and the ground terminal GND, respectively. The resistor R11 is connected between the base and the emitter of the transistor Q5.

When the input signal Sig1 is the L level, all transistors Q1, Q2 and Q5 are in the ON state and the resistor R10 is short-circuited by the transistor Q5. Thus, the voltage drop ΔVL is (i1+i1'+I2+I3)×R7+Vce. Here, Vce is a collector-emitter voltage of the transistor Q5. When the input signal Sig2 is the H level, all transistors Q1, Q2 and Q5 are in the OFF state and the voltage drop ΔVH is (I2+I3)×(R7+R10). In this embodiment, the resistance values (R7 and R10) of the resistors R7 and R10 are so determined that the voltage drops ΔVL and ΔVH equal, that is, the resistance of the resistor R10 is [(i1+i1')×R7+Vce]/(I2+I3). Thus, the voltage drop ΔV between the ground terminal GND and the reference potential E is maintained unchanged. As a result, the threshold voltage Vth of the comparator CP1 can be maintained unchanged even if the input signal Sig1 varies to H level and L level.

It is noted that this third embodiment may be modified so that the resistance correction circuit 18 is applied to the power supply terminal +B side, that is, to the current limit resistor R7 in the second embodiment shown in FIG. 3. Further, the comparator circuit 14 in the third embodiment may be modified in the similar manner as in the modifications shown in FIGS. 4 and 5. Further, the bipolar transistors Q1, Q2 and Q5 may be replaced with MOS transistors as in the modification shown in FIG. 6.

In the above embodiments and modifications, the signal processor circuit 12 is exemplified as a signal level converter circuit. However, this circuit 12 may be, for example, a filter circuit (LPF, HPF, BPF, EPF), a waveform shaping circuit, a latch circuit or the like, if the circuit conducts electric signal processing on the input signal in which the consumption current varies based on the signal voltage of the input signal. Further, the electronic circuit device 10 need not be an integrated circuit (IC) but may be a discrete circuit device using discrete component parts.

What is claimed is:

1. An electronic circuit device connectable to at least one of a power supply potential side and a reference potential side of a power supply device through a current limit resistor that limits a current to a given value, the electronic circuit device comprising:
    a signal processor circuit that conducts given signal processing on a first input signal applied to a first input terminal and consumes a consumption current, which varies in accordance with a signal voltage of the first input signal;
    a voltage comparator circuit that compares a signal voltage of a second input signal applied to a second input terminal separately from the first input signal with a given reference voltage produced based on a power supply potential of the power supply device to output a comparison result; and
    a correction circuit that corrects a voltage drop of the current limit resistor in accordance with a variation of the consumption current of the signal processor circuit thereby to maintain the given reference voltage unchanged.

2. The electronic circuit device according to claim 1, wherein:
    the correction circuit includes a current correction circuit that generates a correction current for offsetting the variation of the consumption current of the signal processor circuit.

3. The electronic circuit device according to claim 2, wherein:
    the current correction circuit includes a constant current source that allows a given constant current to flow, and a current supply section that supplies the correction current based on the given constant current; and
    the current supply section allows, when the signal voltage of the first input signal takes two values of a first level and a second level, a flow of the correction current which is supplied at the time of decreasing the consumption current of the signal processor circuit with an increment or a decrement of the consumption current by the signal processor circuit before and after one of the first and second levels changes to the other level as the correction current, to thereby offset the increment or the decrement of the consumption current of the signal processor circuit.

4. The electronic circuit device according to claim 1, wherein:
    the correction circuit includes a resistance correction circuit that is connected to the current limit resistor to change a resistance of the current limit resistor based on the signal voltage of the first input signal.

5. The electronic circuit device according to claim 4, wherein:
    the resistance correction circuit includes a series resistor connected in series to the current limit resistor, and a transistor connected in parallel to the series resistor to change a resistance of the series resistor based on the signal voltage of the first input signal.

* * * * *